United States Patent
Dolejsi et al.

(10) Patent No.: US 12,444,678 B2
(45) Date of Patent: Oct. 14, 2025

(54) SPACER-BASED SELF-ALIGNED INTERCONNECT FEATURES

(71) Applicant: Intel Corporation, Santa Clara, CA (US)

(72) Inventors: Moshe Dolejsi, Portland, OR (US); Travis W. Lajoie, Forest Grove, OR (US); Abhishek Anil Sharma, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 706 days.

(21) Appl. No.: 17/692,346

(22) Filed: Mar. 11, 2022

(65) Prior Publication Data

US 2023/0290726 A1 Sep. 14, 2023

(51) Int. Cl.
*H01L 23/528* (2006.01)
*H01L 21/768* (2006.01)
*H10B 12/00* (2023.01)

(52) U.S. Cl.
CPC ...... *H01L 23/528* (2013.01); *H01L 21/76834* (2013.01); *H01L 21/76897* (2013.01); *H10B 12/30* (2023.02)

(58) Field of Classification Search
CPC ............. H01L 23/528; H01L 21/76897; H01L 21/76831; H01L 23/5226; H10B 12/30; H10B 12/0335
See application file for complete search history.

(56) References Cited

U.S. PATENT DOCUMENTS

| | | | | |
|---|---|---|---|---|
| 2012/0292741 | A1* | 11/2012 | Dalton | H01L 21/76832 257/536 |
| 2013/0093093 | A1* | 4/2013 | Lee | H10B 12/0335 257/E21.585 |
| 2016/0148869 | A1* | 5/2016 | Schenker | H01L 21/02167 438/618 |
| 2017/0330761 | A1* | 11/2017 | Chawla | H01L 23/53295 |
| 2021/0005548 | A1* | 1/2021 | Lee | H01L 23/5226 |
| 2023/0062416 | A1* | 3/2023 | Wu | H01L 21/76831 |
| 2023/0377966 | A1* | 11/2023 | Wu | H01L 21/76843 |

* cited by examiner

*Primary Examiner* — Bac H Au
(74) *Attorney, Agent, or Firm* — Finch & Maloney PLLC

(57) ABSTRACT

An integrated circuit includes a first conductive structure, a second conductive structure, and a first spacer and a second spacer each comprising a first dielectric material. The integrated circuit further includes a layer comprising a second dielectric material that is compositionally different from the first dielectric material. The integrated circuit further includes a first interconnect feature above and at least partially landed on the first conductive structure. In an example, the first interconnect feature is laterally between the first spacer and the second spacer. The integrated circuit further includes a second interconnect feature above and at least partially landed on the second conductive structure. In an example, the second interconnect feature is laterally between the second spacer and the layer comprising the second dielectric material.

20 Claims, 10 Drawing Sheets

SPACER-BASED SELF-ALIGNED INTERCONNECT FEATURES

FIELD OF THE DISCLOSURE

The present disclosure relates to integrated circuits, and more particularly, to interconnect features for signal routing.

BACKGROUND

As integrated circuits continue to scale downward in size, a number of challenges arise. For instance, it is becoming increasingly difficult to form high density of scaled interconnect features. For example, with scaling, chances of electrical shorting between two adjacent interconnect features increase.

Figure 1A:
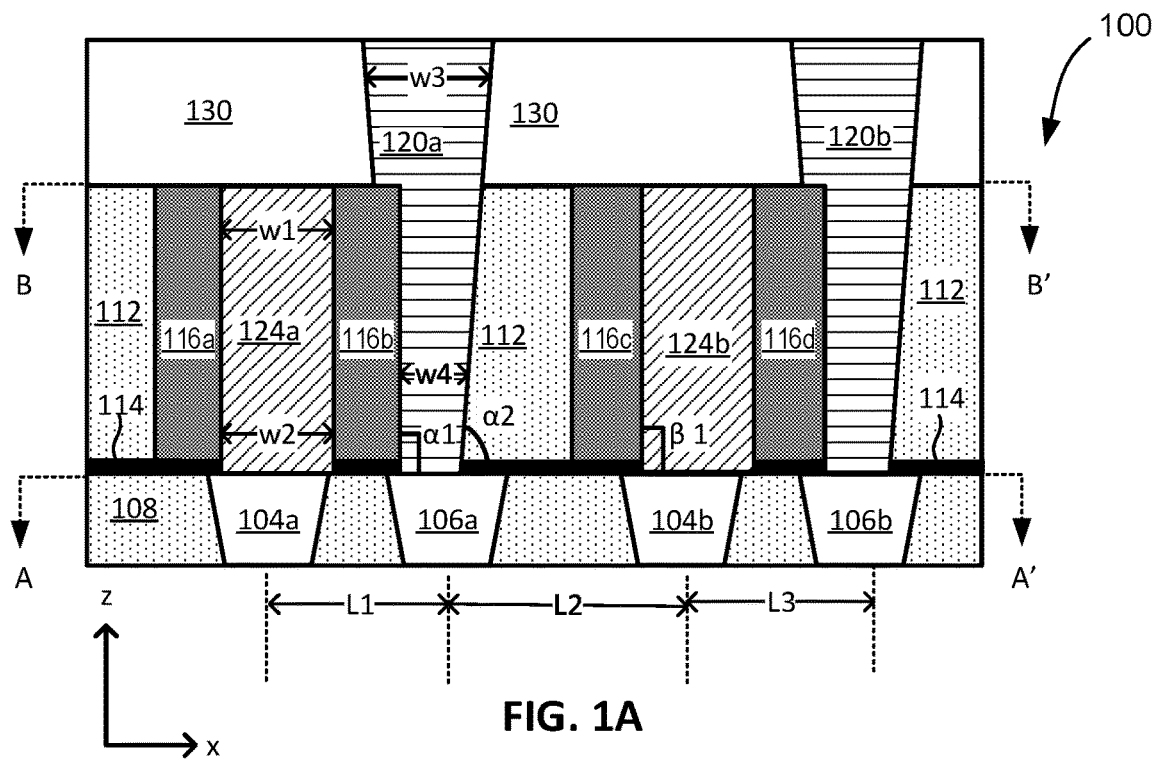
FIG. 1A illustrates a cross-sectional view of a section of an integrated circuit (IC) comprising (i) a plurality of adjacent conductive structures, and (ii) a plurality of interconnect features, wherein each interconnect feature is above and at least partially lands on a corresponding conductive structure, wherein each of first one or more interconnect features of the plurality of interconnect features is laterally between corresponding two spacers comprising a first dielectric material, and wherein each of second one or more interconnect features of the plurality of interconnect features is laterally between (A) a corresponding spacer comprising the first dielectric material and (B) an interlayer dielectric (ILD) layer comprising a second dielectric material that is different from, and etch selective to, the first dielectric material, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles (e.g., curved or tapered sidewalls and round corners), and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Techniques are provided herein for forming interconnect structures for integrated circuits. The techniques are particularly useful with respect to integrated circuit structures comprising high density interconnect features, but can be used to provision any number of interconnect schemes and configurations. In an embodiment, an integrated circuit is provided that includes interconnect features, wherein each of first one or more interconnect features are laterally between and adjacent to corresponding two spacers, and each of second one or more interconnect features are laterally between and adjacent to a corresponding spacer and interlayer dielectric (ILD) material, and wherein the spacers prevent, or otherwise reduce chances of, electrical shorting between adjacent interconnect features. In one such embodiment, for example, an integrated circuit includes a first conductive structure, a second conductive structure, and a first spacer and a second spacer, each spacer comprising a first dielectric material. The integrated circuit further includes a layer, which may be an ILD layer but need not be, comprising a second dielectric material that is compositionally different from the first dielectric material. The integrated circuit further includes a first interconnect feature above and at least partially landed on the first conductive structure. In an example, the first interconnect feature is laterally between the first spacer and the second spacer. The integrated circuit further includes a second interconnect feature above and at least partially landed on the second conductive structure. In an example, the second interconnect feature is laterally between the second spacer and the layer comprising the second dielectric material.

In another embodiment, an integrated circuit includes a conductive structure, a first layer comprising a first dielectric material, and a second layer comprising a second dielectric material that is compositionally different from the first dielectric material. In an example, the first dielectric material is etch selective with respect to the second dielectric material. The integrated circuit further includes an interconnect feature comprising (i) a lower portion that is at least partially landed on the conductive structure, and (ii) an upper portion above the lower portion. In an example, the lower portion is laterally between the first layer and the second layer. In one such example, the upper portion extends above the first layer and at least partially lands on a top surface of the first layer.

In yet another embodiment, an integrated circuit includes a transistor, a capacitor above the transistor, a first layer and a second layer each comprising a first dielectric material, and a third layer comprising a second dielectric material. In an example, each of the first, second, and third layers is between the capacitor and the transistor. The integrated circuit further includes a first interconnect feature coupled to a first terminal of the transistor. In an example, the first interconnect feature is laterally between and adjacent to the first and second layers. The integrated circuit further includes a second interconnect feature that conductive couples a second terminal of the transistor to an electrode of the capacitor. In an example, a lower portion of the second interconnect feature is laterally between and adjacent to the second and third layers. In one such example, the transistor and the capacitor are part of a memory cell, such as a Dynamic Random-Access Memory (DRAM) cell. Numerous variations, embodiments, and applications will be apparent in light of the present disclosure.

General Overview

As previously noted, with increased scaling of microelectronic devices, it is becoming increasingly difficult to support high density of scaled interconnect features. For example, assume a plurality of interconnect features and a plurality of conductive structures, such that each of a number of the interconnect features is above and least partially lands on a corresponding conductive structure. For example, assume a first interconnect feature above and at least partially landing on a first conductive structure, and an adjacent second interconnect feature above and at least partially landing on a second conductive structure. The conductive structures can be, for example, lower level interconnect features, or contacts of one or more active and/or passive devices such as transistors. In an example, due to unintended technical limitations in the process to form the interconnect features, the interconnect features may be laterally shifted with respect to the conductive structures, such that the first interconnect feature may be formed too close to the second conductive feature, e.g., closer than a threshold lateral distance, thereby increasing chances of electrical shorting between the first interconnect feature and the second conductive feature. Similarly, in another example, depending on the direction of the shift, the second interconnect feature may be formed too close to the first conductive feature. This problem is even exacerbated with increased scaling of the microelectronic device, when lateral distance between adjacent interconnect features (or adjacent conductive structures) decrease even more.

Accordingly, techniques are provided herein to form high density of scaled interconnect features. In an embodiment, each of first one or more interconnect features are laterally between and adjacent to corresponding two spacers, and each of second one or more interconnect features are laterally between and adjacent to a corresponding spacer and interlayer dielectric (ILD) material, and wherein the spacers prevents, or reduces chances of, electrical shorting between adjacent interconnect features. The spacers are compositionally different from and etch selective to the ILD material. For example, continuing with the above discussed example of the first interconnect feature at least partially landing on the first conductive structure and the adjacent second interconnect feature at least partially landing on the second conductive structure, the etch selectivity of the spacers to the ILD material reduces chances of a recess for forming the second interconnect feature being too close to, or partially landed on, the first conductive structure, as will be discussed herein below. This, in turn, reduces chances of electrical shorting between the first and second interconnect features.

For instance, continuing with the above example of the first interconnect feature at least partially landing on the first conductive structure and the adjacent second interconnect feature at least partially landing on the second conductive structure, the first interconnect feature is laterally between, and adjacent to, a first spacer and a second spacer. The second interconnect feature is laterally between, and adjacent to, the second spacer and the ILD material, which may be referred to as a "lower ILD" material due to its position relative to another "upper ILD" material that is above the lower ILD material. Thus, the second spacer is laterally between, and adjacent to, the first and second interconnect features.

When forming an IC comprising the above discussed first and second interconnect features, the lower ILD is formed above the adjacent first and second conductive structures. A first recess is formed within the lower ILD and above the first conductive structure. Thus, the first recess lands on the first conductive structure. The first recess has a horizontal width that is a sum of a width of the first interconnect feature, a width of the first spacer, and a width of the second spacer. Thus, the first recess is relatively wide, e.g., relative to the width of the first interconnect feature. Because of the large width of the first recess, it is relatively easier to perform the masking, lithography, and etching process to form the first recess. Note that because of the large width of the first recess, sidewalls of the first recess are relatively less tapered or substantially un-tapered (e.g., a width near a top of the first recess is within 3% or 5% of a width near a bottom of the first recess), according to some embodiments.

Note that the first recess may be unintentionally shifted, e.g., due to unintended technical limitations on mask placement while forming the first recess. For example, an edge of the first recess may even partially land on the second conductive structure. However, due to the spacer-based approach discussed herein below, such partial landing may not create any electrical shorting.

Subsequent to forming the first recess, a conformal layer is deposited on sidewalls of the first recess and on the lower ILD material. Horizontal sections of the conformal layer are then removed, leaving vertical spacers on sidewalls of the first recess, e.g., a first spacer on a first sidewall and a second spacer on a second sidewall of the first recess. In an example, the first and second spacers are part of a continuous spacer, as discussed herein later with respect to FIG. 1D. In an example, although the first recess may partially land on the second conductive structure, the portion of the first recess above the second conductive structure is now occupied by the second spacer, and hence, chances of electrical shorting between a later formed first interconnect feature within the first recess and the second conductive structure is reduced or prevented.

Subsequently, the first interconnect feature is formed within the first recess, such that the first interconnect feature is laterally between the first and second spacers. As discussed, the second spacer reduces or prevents chances of electrical shorting between the first interconnect feature and the second conductive structure.

Subsequently, an upper ILD is deposited on the first and second spacers, the first interconnect feature, and the lower ILD material. The upper ILD and the lower ILD comprising dielectric material are etch-selective to the dielectric material of the spacers.

Subsequently, a second recess is formed within the upper ILD and the lower ILD, and above the second conductive structure. In an example, the second recess may partially land on a top surface of the second spacer, and at least partially land on the second conductive structure. The second spacer separates the second recess from the first interconnect feature. Note that the spacers are etch selective to the upper and lower ILDs. Accordingly, even if the second recess is shifted towards the first interconnect feature, the second spacer is not substantially etched due to the etch selectivity, when the second recess is being formed. Accordingly, the second spacer separates the second recess from the first interconnect feature and the first conductive structure, even in the event of an unintended shift of the second recess, thus improving process margin. For example, an upper portion of the second recess is within the upper ILD, and a lower portion of the second recess is within the lower ILD. The upper portion of the second recess can partially land on the top surface of the second spacer, but the etch process for forming the second recess does not substantially etch the second spacer. Accordingly, the upper portion of the second recess partially lands on the top surface of the second spacer, and then runs down a side surface of the second spacer.

Subsequently, the second interconnect feature is formed within the second recess. As the second spacer separates the second recess from the first interconnect feature and the first conductive structure, the second spacer also separates the second interconnect feature from the first interconnect feature and the first conductive structure, thereby preventing or reducing chances of electrical shorting between the second interconnect feature and the first interconnect feature.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may be used to detect a plurality of interconnect features, wherein a first interconnect feature is laterally between and adjacent to two spacers, and a second interconnect feature is laterally between and adjacent to a corresponding spacer and ILD material. In some such embodiments, such tools may also be used to detect an upper portion of the second interconnect feature landing on a top surface of an adjacent spacer. Numerous configurations and variations will be apparent in light of this disclosure.

Architecture and Methodology

Figure 1B:
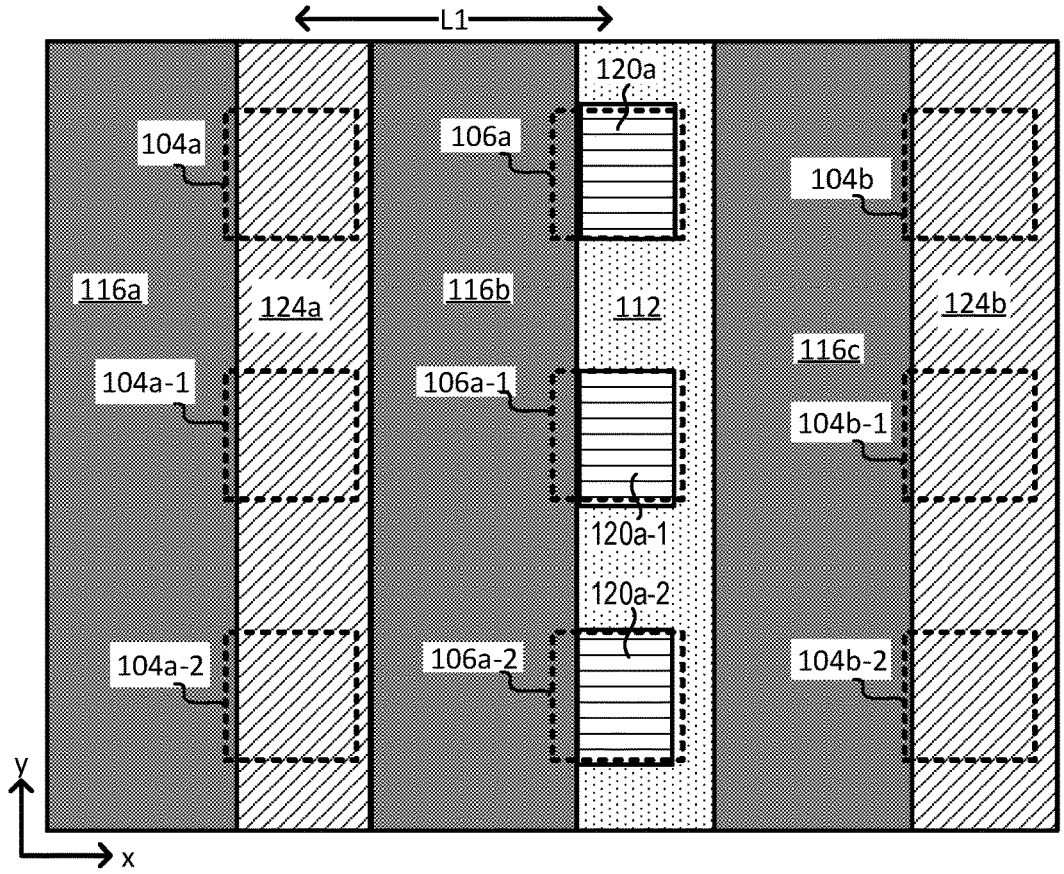
FIGS. 1B, 1C, and 1D illustrate various plan views of the IC of FIG. 1, in accordance with an embodiment of the present disclosure.
Figure 1C:
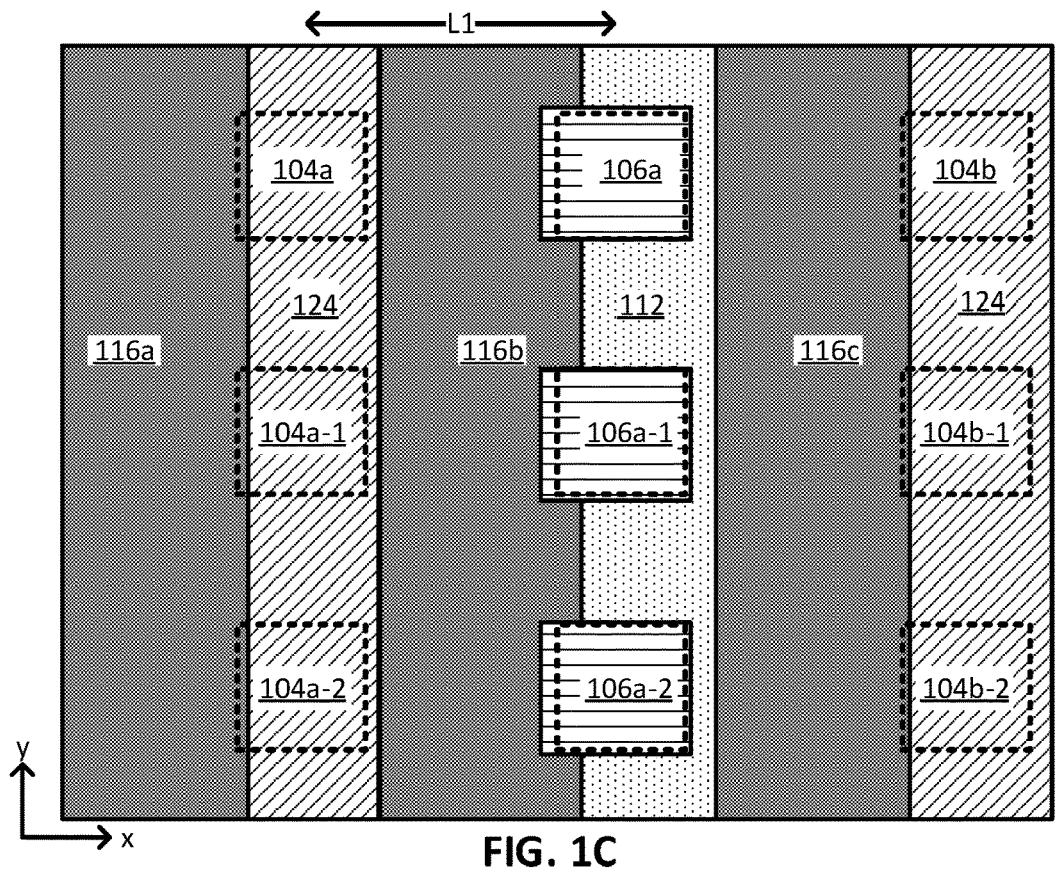
Figure 1D:
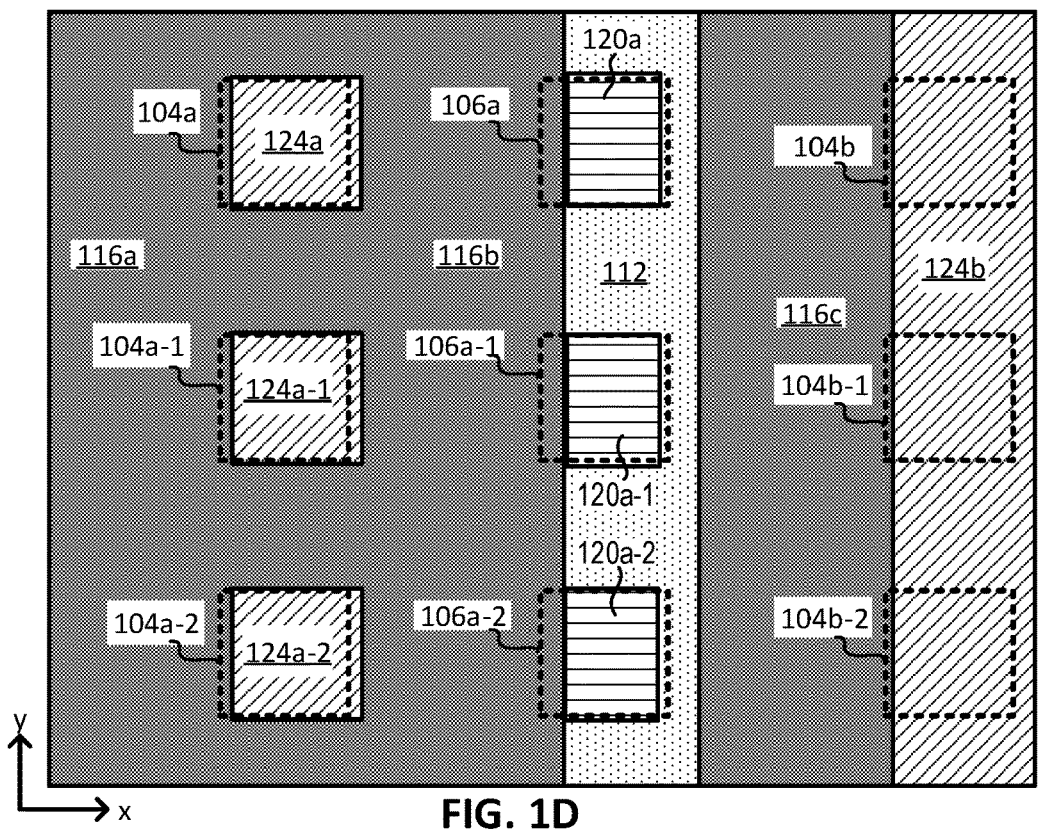
Figure 1E:
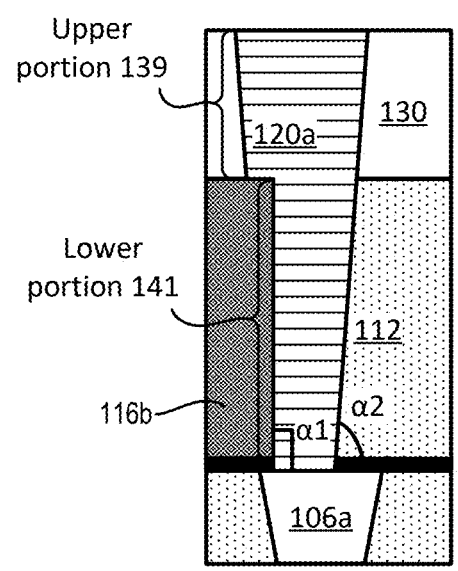
FIG. 1E illustrates an interconnect feature of the second one or more interconnect features of the IC of FIG. 1A in further detail, in accordance with an embodiment of the present disclosure.

FIG. 1A illustrates a cross-sectional view of a section of an integrated circuit (IC) 100 comprising (i) a plurality of adjacent conductive structures 104a, 106a, 104b, 106b, and (ii) a plurality of interconnect features 124a, 120a, 124b, 120b, wherein each interconnect feature is above and at least partially lands on a corresponding conductive structure, wherein each of first one or more interconnect features 124a, 124b of the plurality of interconnect features is laterally between corresponding two spacers 116 comprising a first dielectric material, and wherein each of second one or more interconnect features 120a, 120b of the plurality of interconnect features is laterally between (A) a corresponding spacer 116 comprising the first dielectric material and (B) an ILD layer 112 comprising a second dielectric material that is different from, and etch selective to, the first dielectric material, in accordance with an embodiment of the present disclosure. FIGS. 1B, 1C, and 1D illustrate various plan views of the IC 100 of FIG. 1, in accordance with an embodiment of the present disclosure. FIG. 1E illustrates an interconnect feature 120a of the second one or more interconnect features 120a, 120b of the IC of FIG. 1A in further detail, in accordance with an embodiment of the present disclosure. Although FIG. 1A illustrates merely four conductive structures 104a, 104b, 106a, 106b and four corresponding interconnect features 124a, 124b, 120a, 120b, the IC 100 may include several such conductive structures and several such corresponding interconnect features.

In an example, one or more of the conductive structures 104a, 106a, 104b, 106b are conductive interconnect features, such as conductive lines and/or conductive vias. In another example, one or more of the conductive structures 104a, 106a, 104b, 106b are contacts to one or more active or passive devices, such as transistors, capacitors, inductors, resistors, and/or another appropriate device. For example, FIG. 3 discussed herein later illustrates an example in which the conductive structure 104a is one of a source contact or drain contact of a transistor, and conductive structure 106a is the other of the source contact or drain contact of the transistor. In an example, the conductive structures 104a, 106a, 104b, 106b comprise conductive material, such as one or more metals or an alloy thereof, such as ruthenium, molybdenum, tungsten, aluminum, pure copper, an alloy such as copper-tin (CuSn), copper indium (CuIn), copper-antimony (CuSb), copper-bismuth (CuBi), copper-rhenium (CuRe), and/or any other suitable conductive material.

Figure 3:
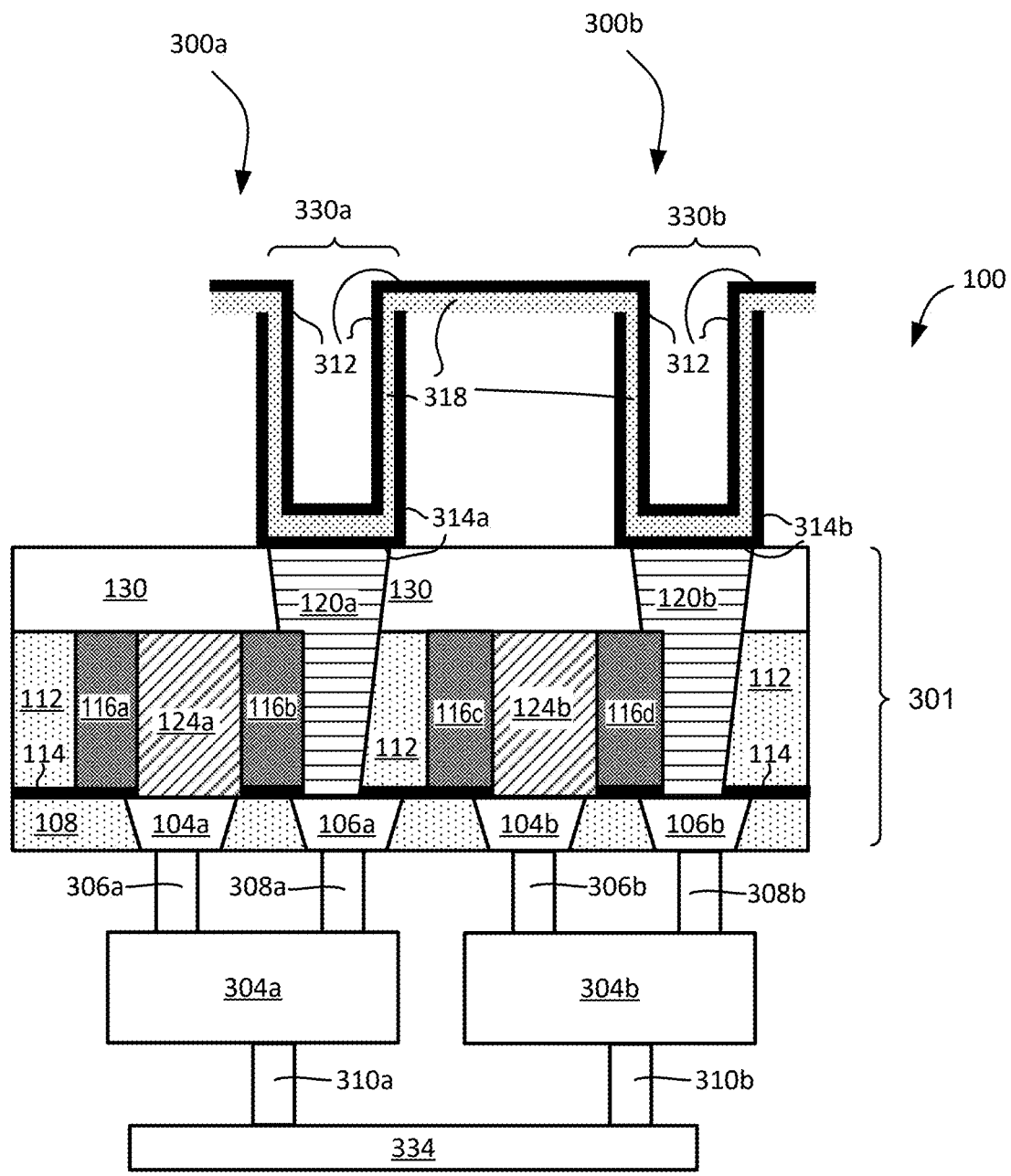
FIG. 3 illustrates the IC of FIG. 1A, and further illustrates example additional components of the IC of FIG. 1A, in accordance with an embodiment of the present disclosure.

As illustrated in FIG. 1A, a lateral distance between mid-points of the conductive structures 104a and 106a is L1, a lateral distance between mid-points of the conductive structures 106a and 104b is L2, and a lateral distance between mid-points of the conductive structures 104b and 106b is L3. In an example, L1 is substantially equal to (e.g., within 5% of) L3, although in another example L1 may be different from L3. In an example, L2 is greater than one or both of L1 and L3. Merely as an example and as illustrated in FIG. 3, conductive structures 104a and 106a are source and drain contacts, respectively (or drain and source contacts, respectively), of a first transistor; and conductive structures 104b and 106b are source and drain contacts, respectively (or drain and source contacts, respectively) of a second transistor. In an example and as discussed in further detail with respect to FIG. 3, one or both the first and second transistors are bottom-gated transistors.

In one embodiment, the conductive structures 104a, 106a, 104b, 106b are at least in part within an ILD 108. The ILD 108 may be an appropriate dielectric material, such as an appropriate oxide, nitride, carbide, an appropriate low-k dielectric material, and/or another appropriate dielectric material.

As illustrated in FIG. 1A, the IC 100 comprises a plurality of spacers 116a, 116b, 116c, 116d (generally referred to herein as spacers 116) and ILD 112. In one embodiment, the spacers 116 comprise first dielectric material and the ILD 112 comprises second dielectric material, wherein the first and second dielectric materials are compositionally different and etch selective with respect to each other. For example, an etch process that etches the dielectric material of the spacers 116 does not substantially etch the ILD 112, and/or another etch process that etches the ILD 112 does not substantially etch the dielectric material of the spacers 116. The dielectric materials of the spacers 124a and ILD 112 may be selected from a wide variety of dielectric materials used in ICs for spacers and ILDs, as long as they are compositionally different and etch selective to each other. Examples of dielectric materials of the spacers 124a and ILD 112 include an appropriate oxide, nitride, carbide, an appropriate low-k dielectric material, and/or another appropriate dielectric material.

In one embodiment, an etch stop layer 114 is between the ILD 108 and the spacers 116, and also between the ILD 108 and the ILD 112. Thus, the etch stop layer 114 is above some sections of the ILD layer 108. As illustrated in FIG. 1, in an example, the etch stop layer 114 is also be present between a section of a conductive structure and a section of a spacer 116 that is in part on the corresponding conductive structure 104. Similarly, in an example, the etch stop layer 114 is also be present between a section of a conductive structure 106 and a section of a spacer 116 that is in part on the conductive structure 106. Similarly, in an example, the etch stop layer 114 is also be present between a section of a conductive structure 106 and a section of the ILD 112 that is on the conductive structure 106. Thus, the etch stop layer 114 is below the spacers 116 and below the ILD 112. However, in an example, the etch stop layer 114 is absent between an interconnect feature 124 and a corresponding conductive structure 104, as illustrated in FIG. 1A. Similarly, the etch stop layer 114 is also absent between an interconnect feature 120 and a corresponding conductive structure 106.

As illustrated in FIG. 1A, the interconnect feature 124a at least partially lands on the conductive structure 104a, the interconnect feature 120a at least partially lands on the conductive structure 106a, the interconnect feature 124b at least partially lands on the conductive structure 104b, and the interconnect feature 120b at least partially lands on the conductive structure 106b. In the example of FIG. 1A, structures of the interconnect features 120a and 120b are at least in part similar, and structures of the interconnect features 124a and 124b are at least in part similar, as will be discussed herein.

As illustrated, the interconnect feature 124a is laterally between two corresponding spacers 116a and 116b, and the interconnect feature 124b is laterally between two corresponding spacers 116c and 116d. In an example, each interconnect feature 124 is adjacent to, and in direct contact with, corresponding spacers 116 on both sides, as illustrated in FIG. 1A. Note that conductive features (such as bit lines, discussed with respect to FIG. 3, or other conductive features such as interconnect features) above, and respectively coupled to, each of the interconnect features 124 are not illustrated in FIG. 1A, so as to not obfuscate the teachings of this disclosure.

Although not illustrated in FIG. 1A, an interconnect feature 124 comprises an appropriate conductive material, and optionally a liner or barrier layer on sidewalls of the interconnect feature. For example, the liner or barrier layer separates the conductive material of the interconnect feature 124 from the adjacent spacers 116. Suitable materials for the liner or barrier layer include liner layer refractory metals and alloys, cobalt, cobalt-nickel (CoNi), ruthenium-cobalt combination, molybdenum, nickel, manganese, titanium-tungsten, tantalum (Ta), tantalum-nitride (TaN), tantalum-silicon-nitride (TaSiN), titanium-nitride (TiN), titanium-silicon-nitride (TiSiN), tungsten (XV), tungsten-nitride (WN), tungsten-silicon-nitride (WiSiN), and/or combinations of such materials (e.g., a multi-lay stack of Ta/TaN). In an example, the liner or barrier layer reduces or prevents diffusion of the conductive material of an interconnect features 124 to adjacent dielectric material of the spacers 116, and/or facilitates better adhesion of the conductive material to walls of the interconnect features 124. In an example, the conductive material of the interconnect features 124 comprise, for example, ruthenium, molybdenum, tungsten, aluminum, pure copper, an alloy such as copper-tin (CuSn), copper indium (CuIn), copper-antimony (CuSb), copper-bismuth (CuBi), copper-rhenium (CuRe), and/or any other suitable conductive material.

In one embodiment, individual the interconnect features 124 has relatively non-tapered shape (e.g., compared to a tapered shape of the interconnect features 120). For example, as illustrated in FIG. 1, a horizontal width of the interconnect feature 124a at or near a top surface of the interconnect feature 124 is w1, and a horizontal width of the interconnect feature 124b at or near a bottom surface of the interconnect feature 124 is w2. In an example, due to the relatively or substantially non-tapered shape of the interconnect feature 124, width w2 is within 10%, or 8%, or 5%, or 3%, or 2%, or 1% of width w1.

In one embodiment, a sidewall of the interconnect feature 124 (such as the left sidewall of the interconnect feature 124b) is at an angle $\beta 1$ with respect to a top surface of the conductive structure 104 below the interconnect feature 124. In an example, due to the relatively or substantially non-tapered shape of the interconnect feature 124, the angle $\beta 1$ is substantially 90 degrees (e.g., within 5 degrees or within 3 degrees of 90 degrees).

As illustrated, the interconnect feature 120a is laterally between the spacer 116b and the ILD 112, and the interconnect feature 120b is laterally between the spacer 116d and the ILD 112. As illustrated in FIG. 1E, each interconnect feature 120 (such as the interconnect feature 120a specifically illustrated in FIG. 1E as an example) has a lower portion 141, and an upper portion 139 above the lower portion 141. In an example, the upper and lower portions of an interconnect feature 120 is formed during a single deposition process, and hence, the interconnect feature 120 comprises a continuous and monolithic body of conductive material within the upper and lower portions, e.g., without any seam, interface, or liner or barrier layer between the upper and lower portions of an interconnect feature 120.

In an example, each interconnect feature 120 (such as the lower portion 141 of the interconnect feature 120, see FIG. 1E) is in direct contact with a corresponding spacer 116 on the left (for example) and with the ILD 112 on the right (for example), as illustrated in FIG. 1A. For example, the lower portion 141 of each interconnect feature 120 is laterally between, and adjacent to (e.g., in direct contact with), a corresponding spacer 116 and the ILD 112.

Although not illustrated in FIG. 1A, an interconnect feature 120 comprises an appropriate conductive material, and optionally a liner or barrier layer on sidewalls of the interconnect feature. For example, the liner or barrier layer separates the conductive material from the adjacent spacers 116 and adjacent ILD 112. Suitable materials for the liner or barrier layer include liner layer refractory metals and alloys, cobalt, cobalt-nickel, ruthenium-cobalt combination, molybdenum, nickel, manganese, titanium-tungsten, tantalum, tantalum-nitride, tantalum-silicon-nitride, titanium-nitride, titanium-silicon-nitride, tungsten, tungsten-nitride, tungsten-silicon-nitride, and/or combinations of such materials (e.g., a multi-lay stack of Ta/TaN). In an example, the liner or barrier layers reduces or prevents diffusion of the conductive material of the interconnect features 120 to adjacent dielectric material of the spacers 116 and/or ILD 112, and/or facilitates better adhesion of the conductive material to walls of the interconnect features 120. In an example, the conductive material of the interconnect features 120 comprise, for example, ruthenium, molybdenum, tungsten, aluminum, pure copper, an alloy such as copper-tin, copper indium, copper-antimony, copper-bismuth, copper-rhenium, and/or any other suitable conductive material.

In one embodiment, individual the interconnect features 120 has relatively tapered shape (e.g., compared to a relatively non-tapered shape of the interconnect features 124). For example, as illustrated in FIG. 1A, a horizontal width of the interconnect feature 120a at or near a top surface of the interconnect feature 120a is w3, and a horizontal width of the interconnect feature 120a at or near a bottom surface of the interconnect feature 120a is w4. In an example, due to the relatively tapered shape of the interconnect feature 120, width w4 is at least 3% less, at least 5% less, or at least 10% less, or at least 15% less, or at least 20% less, or at least 25% less than w3.

A sidewall of the lower portion of an interconnect feature 120 (such as the left sidewall of the interconnect feature 120a) that is adjacent to a spacer 116 (such as the spacer 116b) is at an angle $\alpha 1$ with respect to the top surface of the conductive structure 106 below the interconnect feature 120, as illustrated in FIG. 1A. Another sidewall of the lower portion of an interconnect feature 120 (such as the right sidewall of the interconnect feature 120a) that is adjacent to the ILD 112 is at an angle $\alpha 2$ with respect to the top surface of the conductive structure 106 below the interconnect feature 120, as illustrated in FIG. 1A. In an example, the angle $\alpha 1$ is substantially perpendicular (e.g., with 3 degrees, or within 5 degrees of 90 degrees). In an example, the angle $\alpha 2$ is substantially non-perpendicular, e.g., is at most 85 degrees, or at most 80 degrees, at most 75 degrees. In an example, $\alpha 1$ is greater than $\alpha 2$ by at least 1 degree, or at least 2 degrees, or at least 3 degrees, or at least 5 degrees, or at least 7 degrees, or at least 10 degrees. Thus, put differently, the lower portion of the interconnect feature 120, which is laterally between a corresponding spacer 116 and the ILD 112, has a first sidewall adjacent to the spacer 116 and a second sidewall adjacent to the ILD 112, where the first sidewall of the interconnect feature 120 is substantially non-tapered and substantially perpendicular (angle $\alpha 1$) with respect to the conductive structure 106 below, and where the second sidewall of the interconnect feature 120 is tapered and substantially less than 90 degree angle (angle $\alpha 2$) with respect to the conductive structure 106 below, as illustrated in FIG. 1A.

In one embodiment, a layer of dielectric material 130 is above the spacers 116, as illustrated in FIG. 1A. In one embodiment, the upper portion of individual interconnect features 120 is within the dielectric material 130. Thus, as illustrated, the lower portion of an interconnect feature 120 is laterally between a corresponding spacer 116 and the ILD 111, and the upper portion of an interconnect feature 120 is within the dielectric material 130. For example, as illustrated in FIG. 1A, the upper portion of the interconnect features 120 extend above the spacers 116. For example, the interconnect feature 120a has an upper portion 139 (see FIG. 1E) that partially lands on the spacer 116b, and then the lower portion of the interconnect feature 120a runs down a side surface of the spacer 116b. Similarly, the interconnect feature 120b has an upper portion that partially land on the spacer 116d, and then the lower portion of the interconnect feature 120b runs down a side surface of the spacer 116d.

FIG. 1B illustrate a plan view of a section of the IC 100 along a line A-A' of FIG. 1A, when looking downward. In the plan view of FIG. 1B, the conductive structures 104a, 106a, and 104b are illustrated, and the right-most conductive structure 106b is not illustrated for purposes of illustrative clarity. Furthermore, outline of the conductive structures 104a, 106a, and 104b are illustrated using dotted lines.

Also, an additional row of conductive structures 104a-1, 106a-1, and 104b-1, and a further additional row of conductive structures 104a-2, 106a-2, and 104b-2 are illustrated in FIG. 1B. Merely as an example, the conductive structures 104a, 106a are contacts of a first transistor, the conductive structures 104a-1, 106a-1 are contacts of a second transistor, the conductive structures 104a-2, 106a-2 are contacts of a third transistor, and so on. Similarly, the conductive structure 104b is a contact of a fourth transistor, the conductive structure 104b-1 is a contact of a fifth transistor, and the conductive structure 104b-2 is a contact of a sixth transistor, merely as an example.

In the example of FIG. 1B, the interconnect feature 124a at least partially above the conductive structure 104a is also above the conductive structures 104a-1 and 104-2. Put differently, in the example of FIG. 1B, the interconnect feature 124a above the conductive structures 104a, 104a-1, and 104a-2 are shorted, to form a continuous interconnect feature 124a above the three conductive structures 104a, 104a-1, and 104a-2. However, in another example (see FIG. 1D) and although not illustrated in FIG. 1B, the interconnect feature 124a above the three conductive structures 104a, 104a-1, and 104a-2 may be discontinuous as well, such that a first interconnect feature is above and at least partially landed on the conductive structure 104a, a second interconnect feature is above and at least partially landed on the conductive structure 104a-1, and a third interconnect feature 124 is above and at least partially landed on the conductive structure 104a-2, where the three interconnect features are separate and discontinuous.

Similarly, in the example of FIG. 1B, the interconnect feature 124b above the conductive structures 104b, 104b-1, and 104b-2 are shorted, to form a continuous interconnect feature 124b above the three conductive structures 104b, 104b-1, and 104b-2, although this may not necessarily be the case.

In contrast, in the example of FIG. 1B, the interconnect feature 120a is above and at least partially landed on the conductive structure 106a, an interconnect feature 120a-1 is above and at least partially landed on the conductive structure 106a-1, and an interconnect feature 120a-2 is above and at least partially landed on the conductive structure 106a-2.

As illustrated in the plan view of FIG. 1B, the interconnect feature 124a is laterally between the two spacers 116a and 116b, and the interconnect feature 124b is laterally between the two spacers 116c and 116d (although the spacer 116d is not illustrated in FIG. 1B, but illustrated in FIG. 1A). As also illustrated in the plan view of FIG. 1B, the interconnect feature 120a is laterally between the spacer 116b and the ILD 112. As illustrated, the spacer 116b is at least in part above and partially landed on the conductive structure 106a.

FIG. 1C illustrate a plan view of a section of the IC 100 along a line B-B' of FIG. 1A, when looking downward. In the plan view of FIG. 1C, outlines of the conductive structures 104a, 106a, and 104b are illustrated using dotted lines (e.g., as these conductive structures should not be visible in the plan view of FIG. 1C), and the right-most conductive structure 106b is not illustrated for purposes of illustrative clarity. Also, similar to FIG. 1C, in FIG. 1B the additional row of conductive structures 104a-1, 106a-1, and 104b-1 and further additional row of conductive structures 104a-2, 106a-2, and 104b-2 are also illustrated.

Similar to FIG. 1B, in the example of FIG. 1C, the interconnect feature 124a above the conductive structures 104a, 104a-1, and 104a-2 are shorted, to form a continuous interconnect feature 124a above the three conductive structures 104a, 104a-1, and 104a-2. Similarly, in the example of FIG. 1C, the interconnect feature 124b above the conductive structures 104b, 104b-1, and 104b-2 are shorted, to form a continuous interconnect feature 124b above the three conductive structures 104b, 104b-1, and 104b-2.

In FIG. 1C, a lower surface of the upper portion 139 (see FIG. 1E) of the interconnect feature 120a is illustrated, such as a surface through which the line B-B' of FIG. 1A passes. Note that as illustrated in FIG. 1A, at least a section of the upper portion of the interconnect feature 120a lands on a top surface of the spacer 116b, as illustrated in FIG. 1A and as also illustrated in FIG. 1C. Furthermore, a horizontal width of the interconnect feature 120a illustrated in FIG. 1C is greater than a horizontal width of the interconnect feature 120a illustrated in FIG. 1B, e.g., due to the tapered shape of the interconnect feature 120a. Accordingly, in the example of FIG. 1B, a horizontal width of the interconnect feature 120a is illustrated to be less than a horizontal width of the conductive structure 106a; whereas in the example of FIG. 1C, a horizontal width of the interconnect feature 120a is illustrated to be more than the horizontal width of the conductive structure 106a, e.g., due to the tapered shape of the interconnect feature 120a.

FIG. 1D illustrate a plan view of a section of the IC 100 along the line A-A' of FIG. 1A, when looking downward. The plan view of FIG. 1D is at least in part similar to that in FIG. 1B. However, in the example of FIG. 1B, the interconnect feature 124a above the conductive structures 104a, 104a-1, and 104a-2 are shorted, to form a continuous interconnect feature 124a above the three conductive structures 104a, 104a-1, and 104a-2. In contrast, in the example of FIG. 1D, the interconnect feature above the three conductive structures 104a, 104a-1, and 104a-2 are discontinuous and separate, such that a first interconnect feature 124a is above and at least partially landed on the conductive structure 104a, a second interconnect feature 124a-1 is above and at least partially landed on the conductive structure 104a-1, and a third interconnect feature 124a-2 is above and at least partially landed on the conductive structure 104a-2, where the three interconnect features are separate and discontinuous. Note that in this example, the spacer 116a on left side of the interconnect feature 124a and the spacer 116b on right side of the interconnect feature 124a form a continuous spacer on sidewalls of the interconnect feature 124a.

Figure 2A:
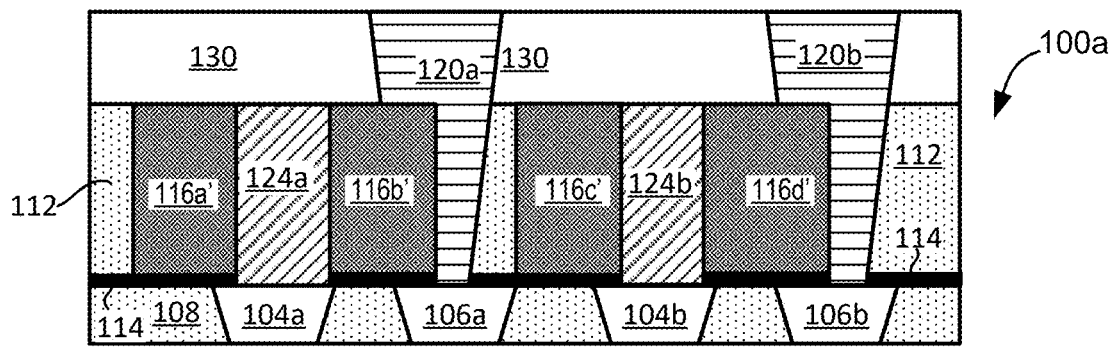
FIG. 2A illustrates cross-sectional view of a section of another IC that is at least in part similar to the IC of FIG. 1A, wherein dimensions of one or more components of the IC of FIG. 1A is different from those of the IC of FIG. 2A, in accordance with an embodiment of the present disclosure.

FIG. 2A illustrates cross-sectional view of a section of another IC 100a that is at least in part similar to the IC 100 of FIG. 1A, wherein dimensions of one or more components of the IC 100 of FIG. 1A is different from those of the IC 100a of FIG. 2A, in accordance with an embodiment of the present disclosure. For example, similar components in FIGS. 1A and 2A are labelled using similar labels. However, the spacers 116a, 116b, 116c, and 116d of the IC 100 of FIG. 1A are respectively re-labelled as spacers 116a', 116b', 116c', and 116d' in the IC 100a of FIG. 2A. Comparing the ICs 100 and 100a of FIGS. 1A and 2A, the spacers 116' of the IC 100a of FIG. 2A are wider or thicker than the spacers 116 of the IC 100 of FIG. 1A (e.g., note the widths w1 and w2 of the spacer 116a of the IC 100 of FIG. 1A). Accordingly, a width of the ILD 112 between the interconnect feature 120a and the spacer 116c' in the IC 100a of FIG. 2A is less than a corresponding width of the ILD 112 between the interconnect feature 120a and the spacer 116c in the IC 100 of FIG. 1A.

Figure 2B:
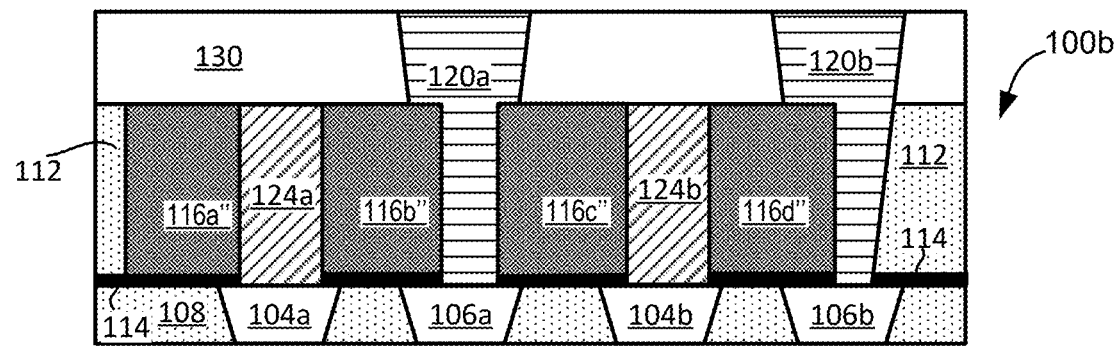
FIG. 2B illustrates cross-sectional view of a section of yet another IC that is at least in part similar to the IC of FIG. 1A, wherein dimensions of one or more components of the IC of FIG. 1A is different from those of the IC of FIG. 2B, in accordance with an embodiment of the present disclosure.

FIG. 2B illustrates cross-sectional view of a section of yet another IC 100b that is at least in part similar to the IC 100 of FIG. 1A, wherein dimensions of one or more components of the IC 100 of FIG. 1A is different from those of the IC 100b of FIG. 2B, in accordance with an embodiment of the present disclosure. For example, similar components in FIGS. 1A and 2A are labelled using similar labels. However, the spacers 116a, 116b, 116c, and 116d of the IC 100 of FIG. 1A are respectively re-labelled as spacers 116a", 116b", 116c", and 116d" in the IC 100b of FIG. 2B. Comparing the ICs 100 and 100b of FIGS. 1A and 2B, the spacers 116" of the IC 100b of FIG. 2B are wider or thicker than the spacers 116 of the IC 100 of FIG. 1A. Accordingly, unlike the IC 100 of FIG. 1A, the ILD 112 is absent between the interconnect feature 120a and the spacer 116c" in the IC 100b of FIG. 2B. Thus, the interconnect feature 120a is now laterally between, and directly adjacent to, the spacers 116b" and 116c".

FIG. 3 illustrates the IC 100 of FIG. 1A, and further illustrates example additional components of the IC 100 of FIG. 1A, in accordance with an embodiment of the present disclosure. Note that FIG. 3 illustrates one example application of the interconnect features of the IC 100 of FIG. 1A, and in other examples the IC 100 of FIG. 1A may be used for other appropriate applications as well.

In the example of FIG. 3, the IC 100 3 comprises a first memory cell 300a and a second memory cell 300b. In an example, individual memory cells 300a and 300b are Dynamic Random-Access Memory (DRAM) memory cells, such as embedded DRAM (eDRAM) memory cells. For example, each of the memory cells 300a, 300b includes a corresponding capacitor 330, a corresponding transistor 304, and interconnect layer 301 between the capacitor and the transistor. Thus, the capacitor 330a and the corresponding transistor 304a form, or are otherwise part of, the corresponding memory cell 300a; and the capacitor 330b and the corresponding transistor 304b form, or are otherwise part of, the corresponding memory cell 300b.

In a memory cell, such as the memory cell 300a for example, the capacitor 330a stores a bit of information and the transistor 304a allows for writing and reading that bit. For example, the capacitor 330a can either be charged or discharged and these two states are used to represent two possible values of 0 or 1 of a bit. In the case of some memory cells, such as DRAM cells, the electric charge on the capacitor 330a gradually leaks, which results in loss of the charge in the capacitor. To prevent this, a DRAM memory cell 330a is periodically refreshed, which involves periodically rewriting the data in the capacitor 330a, to restore the capacitor to an appropriate charge. For purposes of simplicity, some examples and embodiments discussed herein in this disclosure refers to one specific memory cell, such as the memory cell 330a, and the teachings are applicable to other memory cells as well.

As illustrated in FIG. 3, the capacitors 330a, 330b comprise lower electrodes 314a and 31b, respectively. As also illustrated in FIG. 3, the capacitors 330a and 330b also comprise a common upper electrode 312. Thus, the electrode 312 is common to both the capacitors 330a, 330b of the memory cells 300a, 300b, respectively. For example, a first section of the electrode 312 is within the capacitor 330a, and a second section of the electrode 312 is within the capacitor 330b, and the first and second sections of the electrode 312 are conjoined or conductively coupled. In an example where there are more than two memory cells 330a, 330b, the electrode 312 may be common to more than two memory cells.

In each capacitor 330, the electrode 312 is above the corresponding electrode 314. Accordingly, the electrodes 314a, 314b are also referred to herein as lower electrodes of the capacitors, due to their positions relative to the electrode 312; and the electrode 312 is referred to herein as upper electrode. In one embodiment, the electrodes 312, 314a, 314b may include any suitable electrically conductive material, such as a metal or metal alloy material including, e.g., copper, silver, aluminum, tantalum (Ta), aluminum (Al), tungsten (W), nickel (Ni), platinum (Pt), molybdenum (Mo), manganese (Mn), or an alloy thereof, such as titanium nitride (TiN), tantalum nitride (TaN), titanium aluminum nitride (TiAlN), molybdenum oxide (MoO2), manganese oxide (MnO2), tungsten oxide (WO2), or another appropriate conductive material.

In one embodiment, one or more layers 318 is between the upper electrode 312 and the lower electrodes 314a, 314b of the memory cells. The layers 108a comprise dielectric material and form the "I" part of the MIM (metal-insulator-metal) capacitors 330a, 330b. Although not illustrated in FIG. 3, the layers 318 may comprise one or more distinct and/or compositionally different layers of dielectric material. For example, the layers 318 comprise one or more thin films of one or more metal oxides. For example, the layers 318 can include one or more layers of metal oxides, such as one or more oxides of hafnium (Hf), aluminum (Al), zirconium (Zr), titanium (Ti), tantalum (Ta), or another appropriate metal.

Each of the memory cells 330 comprise a corresponding capacitor 330 and a corresponding transistor 304. In FIG. 3, the internal structures of individual transistors 304a, 304b are not illustrated, and the transistors 304a, 304b are illustrated symbolically as a black box. In an example, the transistors 304 are in a gate-bottom configuration, where the source and drain terminals are above the transistor, and the gate terminal is below the transistor.

Each transistor 304 comprises a source contact 306 coupled to a corresponding interconnect feature 124, which is turn is coupled to a corresponding bit line (not illustrated) of the corresponding memory cell. Conductive features (such as bit lines) above, and respectively coupled to, each of the interconnect features 124 are not illustrated in the figures. For example, a source contact 306a of the transistor 304a is coupled to the interconnect feature 124a through the conductive structure 104a, and a source contact 306b of the transistor 304b is coupled to the interconnect feature 124b through the conductive structure 104b.

Each transistor 304 comprises a drain contact 308 coupled to a corresponding interconnect feature 120, which is turn is coupled to a corresponding lower electrode 314 of a corresponding capacitor 330. For example, a drain contact 308a of the transistor 304a is coupled to the interconnect feature 120a, which is turn is coupled to the lower electrode 314a of the capacitor 330a of the memory cell 300a. Similarly, a drain contact 308b of the transistor 304b is coupled to the interconnect feature 120b, which is turn is coupled to the lower electrode 314b of the capacitor 330b of the memory cell 300b.

In one embodiment, the transistor 304a comprises a gate contact 310a coupled to a word line 334, and the transistor 304b comprises a gate contact 310b coupled to the word line 334. Thus, the word line 334 is common for the memory cells 330a, 330b.

Thus, in the example of FIG. 3, the previously discussed interconnect features 120, 124 provide interconnection between the transistors 304a, 304b and various other components, such as the capacitors 330a, 330b, respectively, of the memory cells 300a, 300b, and the bit lines of the memory cells 300a, 330b.

Figure 4:
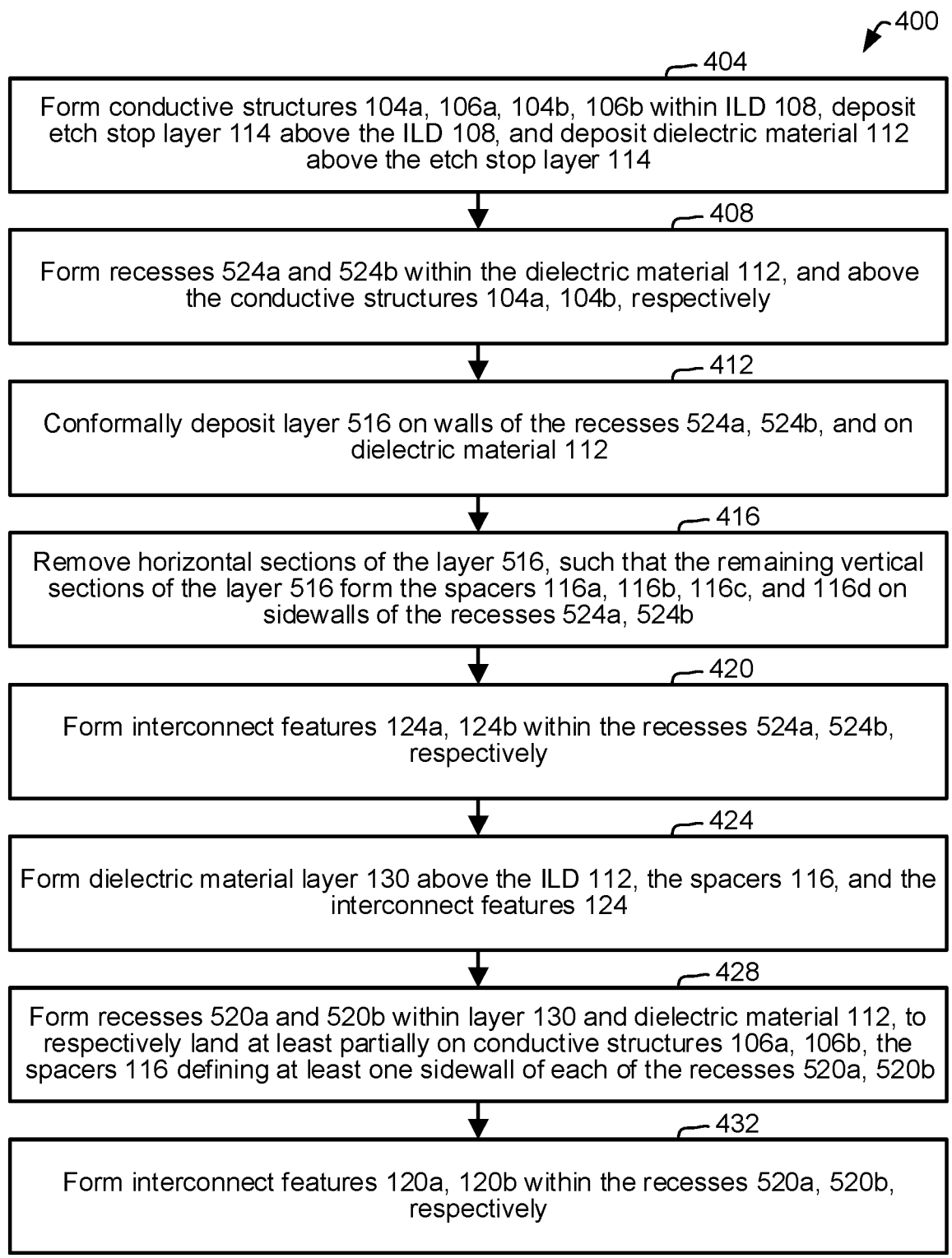
FIG. 4 illustrates a flowchart depicting a method of forming an IC (such as the IC of FIG. 1A) comprising (i) a plurality of adjacent conductive structures, and (ii) a plurality of interconnect features, wherein each interconnect feature is above and at least partially lands on a corresponding conductive structure, wherein each of first one or more interconnect features of the plurality of interconnect features is laterally between corresponding two spacers comprising a first dielectric material, and wherein each of second one or more interconnect features of the plurality of interconnect features is laterally between (A) a corresponding spacer comprising the first dielectric material and (B) an ILD layer comprising a second dielectric material that is different from, and etch selective to, the first dielectric material, in accordance with an embodiment of the present disclosure.

FIG. 4 illustrates a flowchart depicting a method 400 of forming an IC (such as the IC 100 of FIG. 1A) comprising (i) a plurality of adjacent conductive structures 104a, 106a, 104b, 106b, and (ii) a plurality of interconnect features 124a, 120a, 124b, 120b, wherein each interconnect feature is above and at least partially lands on a corresponding conductive structure, wherein each of first one or more interconnect features 124a, 124b of the plurality of interconnect features is laterally between corresponding two spacers 116 comprising a first dielectric material, and wherein each of second one or more interconnect features 120a, 120b of the plurality of interconnect features is laterally between (A) a corresponding spacer 116 comprising the first dielectric material and (B) an ILD layer 112 comprising a second dielectric material that is different from, and etch selective to, the first dielectric material, in accordance with an embodiment of the present disclosure. FIGS. 5A-5H illustrate cross-sectional views of an IC (such as the IC 100 of FIG. 1A) in various stages of processing, in accordance with an embodiment of the present disclosure. FIGS. 4 and 5A-5H will be discussed in unison.

Figure 5A:
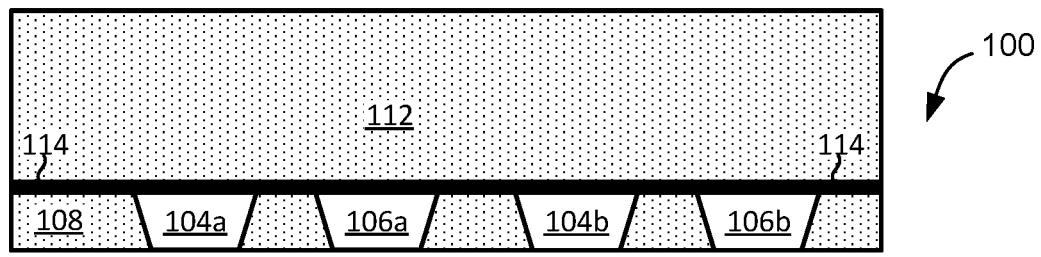
FIGS. 5A-5H illustrate cross-sectional views of an IC (such as the IC of FIG. 1A) in various stages of processing, in accordance with an embodiment of the present disclosure.

Referring to FIG. 4, the method 400 includes, at 404, forming conductive structures 104a, 106a, 104b, 106b within ILD 108, subsequently depositing etch stop layer 114 above the ILD 108, and finally depositing the dielectric material 112 above the etch stop layer 114. The final structure of the IC 100 subsequent to the process 404 is illustrated in FIG. 5A. In an example, the conductive structures 104a, 106a, 104b, 106b are formed within ILD 108 using an appropriate technique to form conductive structures. In an example, the etch stop layer 114 and/or the dielectric material 112 can be deposited using an appropriate deposition technique, such as chemical vapor deposition (CVD), physical vapor deposition (PVD), atomic layer deposition (ALD), vapor-phase epitaxy (VPE), molecular beam epitaxy (MBE), or liquid-phase epitaxy (LPE), for example. Note that there may be various components below the ILD 108, e.g., as discussed with respect to FIG. 3, although such components or formation thereof are not discussed or illustrated in the example of FIGS. 4 and 5A.

Figure 5B:
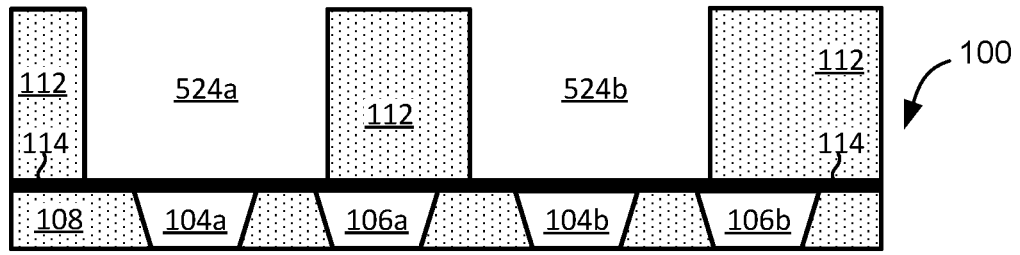

Referring again to FIG. 4, the method 400 then proceeds from 404 to 408, where recesses 524a and 524b are formed within the dielectric material 112, as illustrated in FIG. 5B. As seen, the recesses 524a and 524b are formed above the conductive structures 104a, 104b, respectively. In an example, each of the recesses 524 may be formed within the dielectric material 112 using suitable masking, lithography, and etching technique, such as an anisotropic etch process. In an example, the etch stop layer 114 acts to stop the etching process, when forming the recesses 524. Accordingly, the etch stop layer 114 is between the recess 524a and the conductive structure 104a, and also between the recess 524b and the conductive structure 104b.

In one embodiment, the interconnect feature 124a, the spacer 116a, and the spacer 116b will eventually be formed within the recess 524; and similarly, the interconnect feature 124b, the spacer 116c, and the spacer 116d will eventually be formed within the recess 524b. Accordingly, each of the recesses 524a and 524b has relatively greater width, e.g., compared to the widths of the interconnect features 124. For example, comparing FIG. 5A with FIG. 1A, the recess 524a has a width that is a sum of a width of the interconnect feature 124a, a width of the spacer 116a, and a width of the spacer 116b. Because of the relatively large width of the recesses 524a, 524b, it may be relatively easier to perform the masking, lithography, and etching process to form the recesses (e.g., compared to a situation in which the recess has relatively small width).

Also note that the recesses 524a, 524b need not be perfectly aligned and concentric with respect to the conductive structures 104a and 104b, respectively. For example, due to technical limitations in placing the masks for the recesses 524a, 524b, the recesses 524a, 524b may be shifted from there intended locations, and may not be fully aligned with respect to the conductive structures 104a and 104b, respectively. However, because the spacers 116 are to be eventually deposited, such a slight shift in the locations of the recesses 524a, 524b is acceptable. For example, in FIG. 5B, a right edge of the recess 524a is partially above on the conductive structure 106a. However, due to the spacers 116 (to be deposited later in the process), such partial overlapping of the recess 524a with the conductive structure 106a does not result in any electrical shorting during subsequent processing of the IC 100.

Figure 5C:
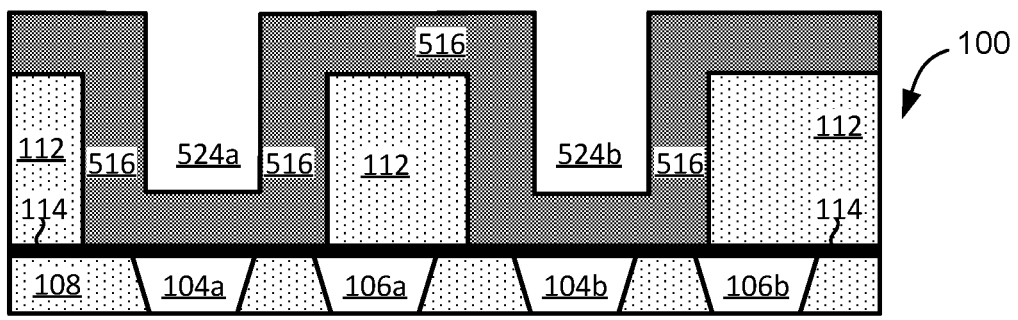

Referring again to FIG. 4, the method 400 then proceeds from 408 to 412, where a layer 516 comprising dielectric material is deposited on walls of the recesses 524a, 524b, and on the dielectric material 112, as illustrated in FIG. 5C. In an example, the layer 516 is conformally deposited using an appropriate deposition technique, such as CVD, PVD, ALD, VPE, MBE, or LPE, for example. The layer 516 eventually is used to form the spacers 116, and hence, the dielectric material of the layer 516 comprises the material of the spacers 116. In an example, the dielectric material of the layer 516 and the dielectric material 112 are etch selective with respect to each other, as previously discussed herein.

Figure 5D:
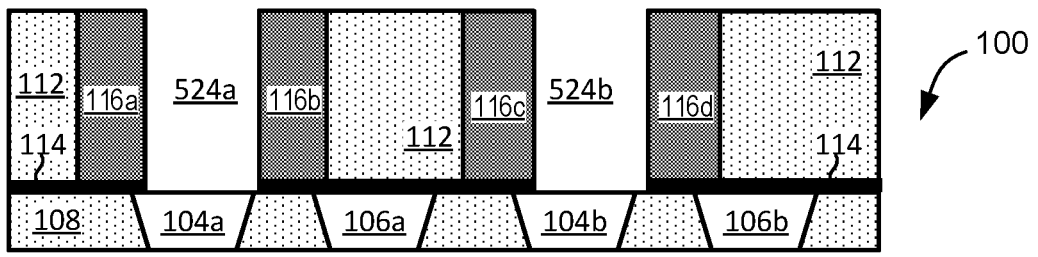

Referring again to FIG. 4, the method 400 then proceeds from 412 to 416, where horizontal sections of the layer 516 are removed, such that the remaining vertical sections of the layer 516 form the spacers 116a, 116b, 116c, and 116d on sidewalls of the recesses 524a, 524b, as illustrated in FIG. 5D. The horizontal sections of the layer 516 are removed using an appropriate etching process. In an example, when removing the horizontal sections of the layer 516, sections of the etch stop layer 114 on the conductive structures 104, 106 are also removed, as illustrated in FIG. 5D. As the spacers 116a, . . . , 116d are formed from the same conformal layer 516, in an example, each of the spacers 116a, . . . , 116d have substantially same thickness or horizontal width (e.g., the thickness or horizontal widths of the spacers 116a, . . . , 116d may be within 1%, or within 2%, or within 3%, or within 5% of each other).

Figure 5E:
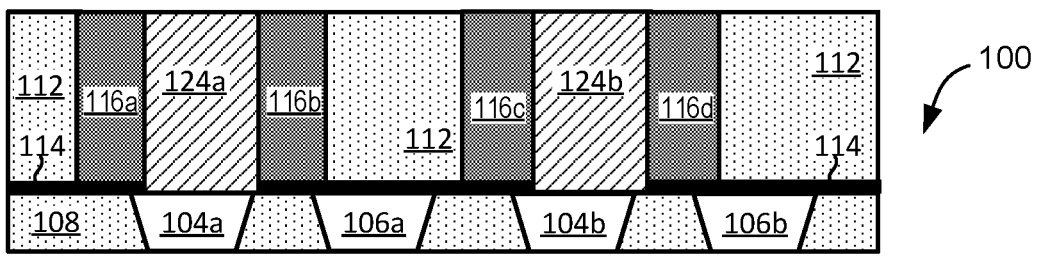

Referring again to FIG. 4, the method 400 then proceeds from 416 to 420, where interconnect features 124a, 124b are formed within the recesses 524a, 524b, respectively, as illustrated in FIG. 5E. In an example, formation of the interconnect features 124a, 124b include optionally depositing (e.g., conformally depositing) a barrier or liner layer (not illustrated) on sidewalls of the recesses 524a, 524b, where the barrier or liner layer has been discussed herein previously. Subsequently, conductive material of the interconnect features is deposited within each of the recesses 524a, 524b, to respectively form the interconnect features 124a, 124b. In an example, the conductive material is deposited using an appropriate deposition technique, such as CVD, PVD, ALD, VPE, MBE, LPE, or electroplating, for example.

Figure 5F:
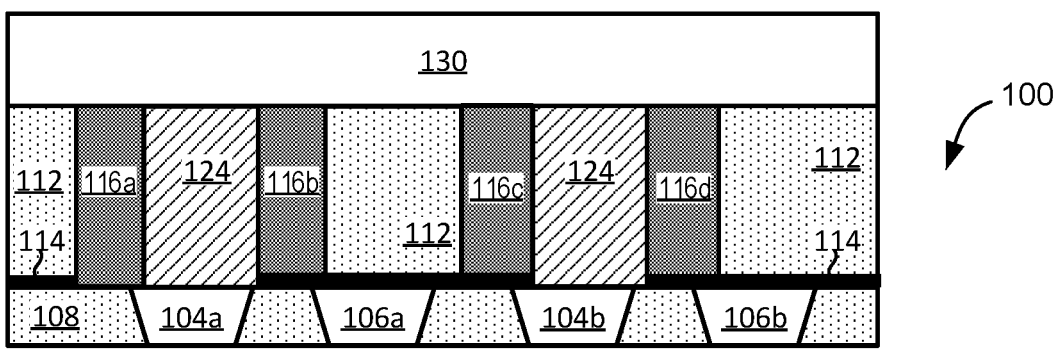

Referring again to FIG. 4, the method 400 then proceeds from 420 to 424, where dielectric material layer 130 is formed above the ILD 112, the spacers 116, and the interconnect features 124, as illustrated in FIG. 5F. In an example, the dielectric material layer 130 is deposited using an appropriate deposition technique, such as CVD, PVD, ALD, VPE, MBE, or LPE, for example.

Figure 5G:
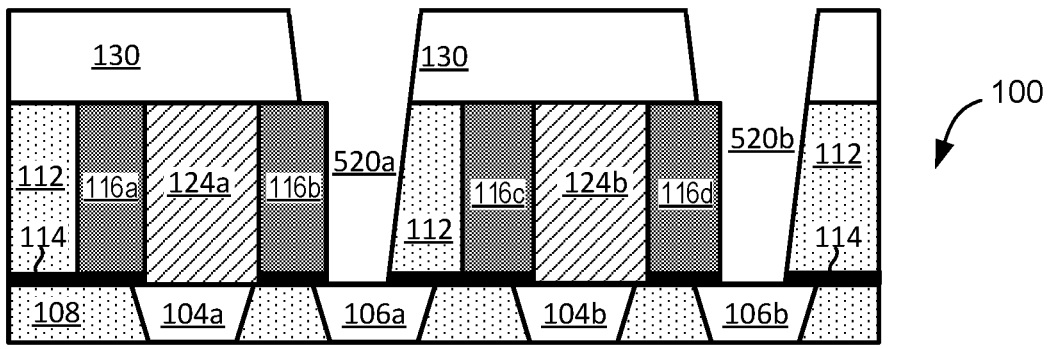

Referring again to FIG. 4, the method 400 then proceeds from 424 to 428, where recesses 520a and 520b are formed within layer 130 and dielectric material 112, to respectively land at least partially on conductive structures 106a, 106b, as illustrated in FIG. 5G. As also illustrated in FIG. 5G, a corresponding spacer 116 define at least one sidewall of each of the recesses 520a, 520b. As discussed, the dielectric material of the spacers 116 are etch selective to the dielectric materials of the layers 130 and 112. Accordingly, the recess formation process 428 does not substantially etch the spacers 116.

Figure 5H:
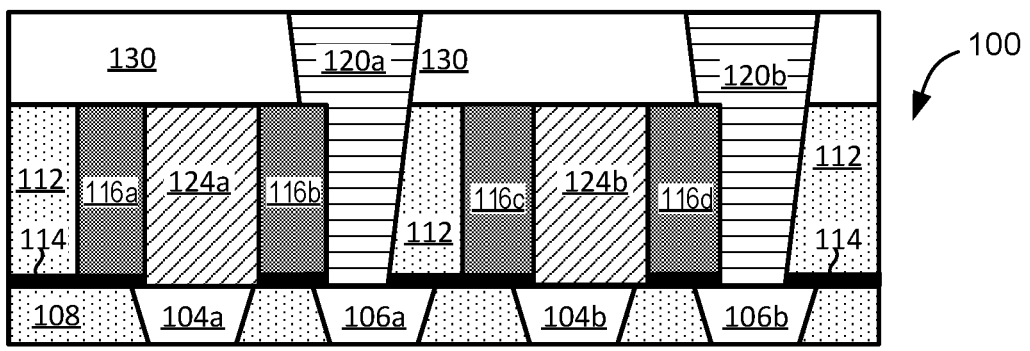

Referring again to FIG. 4, the method 400 then proceeds from 428 to 432, where interconnect features 120a, 120b are formed within the recesses 520a, 520b, respectively, as illustrated in FIG. 5H. The formation process 432 is at least in part similar to the previously discussed interconnect feature formation process 420. The resultant IC 100 of FIG. 5H is similar to the IC 100 of FIG. 1A.

Note that the processes in method 400 are shown in a particular order for ease of description. However, one or more of the processes may be performed in a different order or may not be performed at all (and thus be optional), in accordance with some embodiments. Numerous variations on method 400 and the techniques described herein will be apparent in light of this disclosure.

In an example, the spacers 116 prevent or reduces chances of any unintended electrical shorting in the IC 100 of FIG.

1A. For example, when forming the interconnect features 120, 124, masking, lithography, and etching processes are employed. The masks may be slightly shifted from their intended locations, e.g., due to unintended technical limitations in mask placement, resulting in shifting of the interconnect features 120, 124, and possible misalignment between an interconnect feature 120, 124 and a conductive structure underneath. For example, such unintended shift may even result in the interconnect feature 124*a* being too close to (e.g., closer than a threshold minimum distance to prevent dielectric breakdown) or even partially landing on the conductive structure 106*a*, for example, which may result in untended electrical shorting between the interconnect feature 124*a* and the conductive structure 106*a*. However, as discussed herein (e.g., with respect to FIG. 5B), a recess 524*a* is formed, where the recess 524*a* may even partially land on the conductive structure 106*a*. However, spacers 116 are formed on sidewalls of the recess 524*a*, and the spacers 116 prevent or reduce chances of unintentional shorting between the interconnect feature 124*a* and the conductive structure 106*a*. Additionally, as illustrated in FIGS. 5G and 5H, the spacer 116*b* ensure that a left edge of the interconnect feature 120*a* cannot be too close to, or cannot partially land on the conductive structure 104*a*. Thus, even if the mask for forming the recess 520*a* shifts unintentionally to the left, for example, the spacers 116*b* ensures that the left edge of the recess 520*a*, and hence, the left edge of the interconnect feature 120*a* is more than a threshold distance from the conductive structure 104*a*, thereby preventing or reducing chances of unintended electrical shorting between the interconnect feature 120*a* and the conductive structure 104*a*. Thus, the structures of the interconnect features 120, 124 and the spacers 116 prevent, or reduce chances of, unintended electrical shorting in the IC 100. This facilitates in scaling of the components of the IC 100 (e.g., reducing dimensions of the components, such as reducing distance between the conductive structures 104*a* and 106*a*, and/or reducing distance between the interconnect features 124*a* and 120*a*), without correspondingly increasing chances of electrical shorting in the IC 100.

Example System

Figure 6:
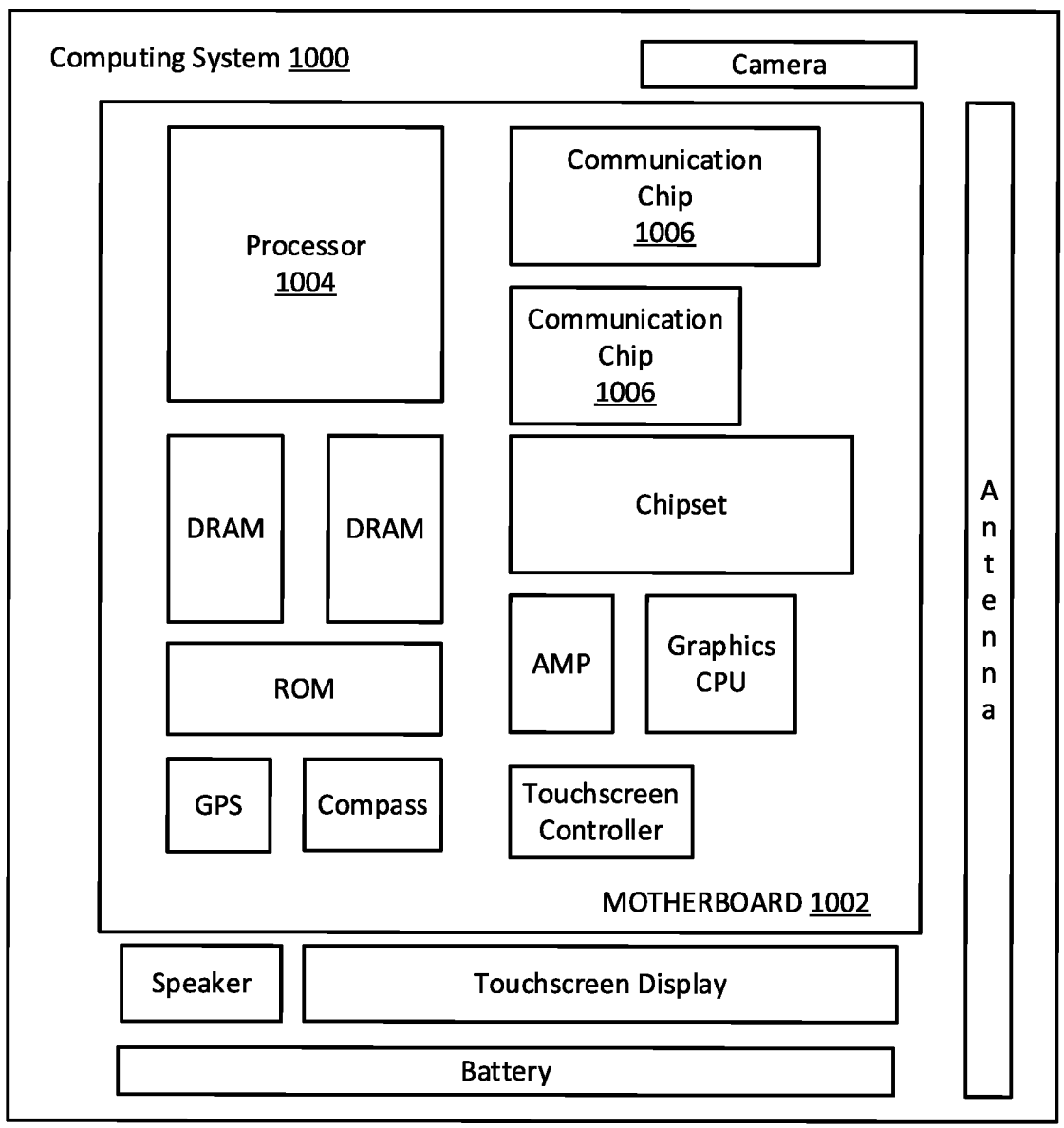
FIG. 6 illustrates a computing system implemented with integrated circuit structures having one or more interconnect features formed using the techniques disclosed herein, in accordance with some embodiments of the present disclosure.

FIG. 6 illustrates a computing system 1000 implemented with integrated circuit structures and/or the interconnect features formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1. An integrated circuit comprising: a first conductive structure and a second conductive structure; a first spacer and a second spacer each comprising a first dielectric material; a layer comprising a second dielectric material that is compositionally different from the first dielectric material; a first interconnect feature above and at least partially landed on the first conductive structure, wherein the first interconnect feature is laterally between the first spacer and the second spacer; and a second interconnect feature above and at least partially landed on the second conductive structure, wherein the second interconnect feature is laterally between the second spacer and the layer comprising the second dielectric material.

Example 2. The integrated circuit of example 1, wherein: the second interconnect feature has a tapered shape, such that a first width of the second interconnect feature at or near a top surface of the second interconnect feature is at least 5% greater than a second width of the second interconnect feature at or near a bottom surface of the second interconnect feature; and the first interconnect feature has a non-tapered shape, such that a first width of the first interconnect feature at or near a top surface of the first interconnect feature is within 5% of a second width of the first interconnect feature at or near a bottom surface of the first interconnect feature.

Example 3. The integrated circuit of any one of examples 1-2, wherein the second interconnect feature partially lands on a top surface of the second spacer and runs down a side surface of the second spacer.

Example 4. The integrated circuit of any one of examples 1-3, wherein: the layer comprising the second dielectric material is a first layer; a lower portion of the second interconnect feature is laterally between the second spacer and the first layer; and an upper portion of the second interconnect feature extends within a second layer comprising a third dielectric material, the first dielectric material being etch selective to one or both the second and third dielectric materials.

Example 5. The integrated circuit of any one of examples 1-4, wherein: a lower portion of the second interconnect feature is laterally between the second spacer and the layer comprising the second dielectric material, and has (i) a first sidewall adjacent to the second spacer, and (ii) a second sidewall adjacent to the layer comprising the second dielectric material; and the first sidewall is at a first angle with a top surface of the second conductive structure, the second sidewall is at a second angle with the top surface of the second conductive structure, and the first angle is at least 3 degrees greater than the second angle.

Example 6. The integrated circuit of any one of examples 1-5, wherein: a lower portion of the second interconnect feature is laterally between the second spacer and the layer comprising the second dielectric material, and has (i) a first sidewall adjacent to the second spacer, and (ii) a second sidewall adjacent to the layer comprising the second dielectric material; and the first sidewall is at a first angle with a top surface of the second conductive structure, the second sidewall is at a second angle with the top surface of the second conductive structure, the first angle is substantially 90 degrees, and the second angle is at most 85 degrees.

Example 7. The integrated circuit of example 6, wherein the second interconnect feature comprises a continuous and monolithic body of conductive material within the upper and lower portions.

Example 8. The integrated circuit of any one of examples 1-7, wherein the first dielectric material of the first spacer and second spacers is etch selective with respect to the second dielectric material of the layer.

Example 9. The integrated circuit of any one of examples 1-8, wherein the first spacer at least partially lands on the first conductive structure, and the second spacer at least partially lands on one or both the first and second conductive structures.

Example 10. The integrated circuit of any one of examples 1-9, wherein the first conductive structure is a contact to one of a source or a drain of a transistor, and the second conductive structure is a contact to the other of the source or a drain of the transistor.

Example 11. The integrated circuit of example 10, wherein the transistor is a bottom-gated transistor, such that source and drain contacts of the transistor is above the transistor, and a gate contact of the transistor is below the transistor.

Example 12. The integrated circuit of any one of examples 1-11, wherein one of the first or second conductive structures is coupled to an electrode of a capacitor, and the other of the first or second conductive structures is coupled to a bit line of a memory array.

Example 13. The integrated circuit of example 12, wherein the first and second conductive structures is coupled to a transistor, and wherein the transistor and the capacitor form a memory cell of the memory array.

Example 14. The integrated circuit of any one of examples 1-13, wherein one of the first interconnect feature is a bit line of a memory array, and the second interconnect feature is a via.

Example 15. An integrated circuit comprising: a conductive structure; a first layer comprising a first dielectric material, and a second layer comprising a second dielectric material that is compositionally different from the first dielectric material; and an interconnect feature comprising (i) a lower portion that is at least partially landed on the conductive structure, and (ii) an upper portion above the lower portion, wherein the lower portion is laterally between the first layer and the second layer, and wherein the upper portion extends above the first layer and at least partially lands on a top surface of the first layer.

Example 16. The integrated circuit of example 15, wherein the interconnect feature comprises a continuous and monolithic body of conductive material within the upper and lower portions.

Example 17. The integrated circuit of any one of examples 15-16, wherein the upper portion of the interconnect feature extends above the second layer.

Example 18. The integrated circuit of any one of examples 15-17, wherein the upper portion of the interconnect feature is within a third layer comprising a third dielectric material that is compositionally different from the first dielectric material.

Example 19. The integrated circuit of example 18, wherein the third dielectric material is etch selective with respect to the first dielectric material.

Example 20. The integrated circuit of any one of examples 18-19, wherein the first dielectric material is etch selective with respect to the second dielectric material.

Example 21. The integrated circuit of any one of examples 15-20, wherein: the lower portion of the interconnect feature has (i) a first sidewall adjacent to the first layer, and (ii) a second sidewall adjacent to the second layer; and the first sidewall is at a first angle with a top surface of the conductive structure, the second sidewall is at a second angle with the top surface of the conductive structure, and the first angle is at least 3 degrees greater than the second angle.

Example 22. The integrated circuit of example 21, wherein the first angle is substantially 90 degrees, and the second angle is at most 85 degrees.

Example 23. The integrated circuit of any one of examples 15-22, wherein the conductive structure is a first conductive structure, wherein the interconnect feature is a first interconnect feature, and wherein the integrated circuit further comprises: a second conductive structure; a third layer comprising the first dielectric material; and a second interconnect feature laterally between the first layer and the third layer.

Example 24. The integrated circuit of example 23, wherein the first interconnect feature is directly adjacent to each of the first layer and the third layer.

Example 25. The integrated circuit of any one of examples 23-24, wherein the first interconnect feature has a more tapered shape than the second interconnect feature.

Example 26. The integrated circuit of any one of examples 23-25, wherein the first interconnect feature has a more tapered shape than the second interconnect feature, such that: a first width of the first interconnect feature at or near a top surface of the first interconnect feature is at least 5% greater than a second width of the first interconnect feature at or near a bottom surface of the first interconnect feature; and a first width of the second interconnect feature at or near a top surface of the second interconnect feature is within 5% of a second width of the second interconnect feature at or near a bottom surface of the second interconnect feature.

Example 27. The integrated circuit of any one of examples 15-26, wherein one or both the first and second layers at least partially lands on the conductive structure.

Example 28. The integrated circuit of any one of examples 15-27, wherein the lower portion of the interconnect feature is directly adjacent to each of the first layer and the second layer.

Example 29. An integrated circuit comprising: a transistor; a capacitor above the transistor; a first layer and a second layer each comprising a first dielectric material, and a third layer comprising a second dielectric material, each of the first, second, and third layers between the capacitor and the transistor; a first interconnect feature coupled to a first terminal of the transistor, the first interconnect feature laterally between and adjacent to the first and second layers; and a second interconnect feature that conductive couples a second terminal of the transistor to an electrode of the capacitor, wherein a lower portion of the second interconnect feature is laterally between and adjacent to the second and third layers.

Example 30. The integrated circuit of example 29, wherein: the second interconnect feature comprises (i) the lower portion that is laterally between and adjacent to the second and third layers, and (ii) an upper portion above the lower portion; and the upper portion partially lands on a top surface of the second layer.

Example 31. The integrated circuit of any one of examples 29-30, wherein the transistor and the capacitor are part of a memory cell.

Example 32. The integrated circuit of example 31, wherein the first interconnect feature is coupled to a bit line of the memory cell.

Example 33. The integrated circuit of any one of examples 29-32, wherein the transistor and the capacitor are part of a Dynamic Random-Access Memory (DRAM) cell.

Example 34. The integrated circuit of any one of examples 29-33, wherein the first terminal is one of a source or drain terminal of the transistor, and the second terminal is the other of the source or drain terminal of the transistor.

Example 35. The integrated circuit of any one of examples 29-34, wherein the first terminal and the second terminal are above the transistor, and a gate terminal of the transistor is below the transistor.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
   a first conductive structure and a second conductive structure;
   a first spacer and a second spacer each comprising a first dielectric material;
   a layer comprising a second dielectric material that is compositionally different from the first dielectric material;
   a first interconnect feature above and at least partially landed on the first conductive structure, wherein the first interconnect feature is laterally between the first spacer and the second spacer; and
   a second interconnect feature above and at least partially landed on the second conductive structure, wherein the second interconnect feature is laterally between the second spacer and the layer comprising the second dielectric material.

2. The integrated circuit of claim 1, wherein:
   the second interconnect feature has a tapered shape, such that a first width of the second interconnect feature at or near a top surface of the second interconnect feature is at least 5% greater than a second width of the second interconnect feature at or near a bottom surface of the second interconnect feature; and
   the first interconnect feature has a non-tapered shape, such that a first width of the first interconnect feature at or near a top surface of the first interconnect feature is within 5% of a second width of the first interconnect feature at or near a bottom surface of the first interconnect feature.

3. The integrated circuit of claim 1, wherein the second interconnect feature partially lands on a top surface of the second spacer and runs down a side surface of the second spacer.

4. The integrated circuit of claim 1, wherein:
   the layer comprising the second dielectric material is a first layer;

a lower portion of the second interconnect feature is laterally between the second spacer and the first layer; and an upper portion of the second interconnect feature extends within a second layer comprising a third dielectric material, the first dielectric material being etch selective to one or both the second and third dielectric materials.

5. The integrated circuit of claim 1, wherein:

a lower portion of the second interconnect feature is laterally between the second spacer and the layer comprising the second dielectric material, and has (i) a first sidewall adjacent to the second spacer, and (ii) a second sidewall adjacent to the layer comprising the second dielectric material; and the first sidewall is at a first angle with a top surface of the second conductive structure, the second sidewall is at a second angle with the top surface of the second conductive structure, and the first angle is at least 3 degrees greater than the second angle.

6. The integrated circuit of claim 1, wherein:

a lower portion of the second interconnect feature is laterally between the second spacer and the layer comprising the second dielectric material, and has (i) a first sidewall adjacent to the second spacer, and (ii) a second sidewall adjacent to the layer comprising the second dielectric material; and the first sidewall is at a first angle with a top surface of the second conductive structure, the second sidewall is at a second angle with the top surface of the second conductive structure, the first angle is substantially 90 degrees, and the second angle is at most 85 degrees.

7. The integrated circuit of claim 6, wherein the second interconnect feature comprises a continuous and monolithic body of conductive material within the upper and lower portions.

8. The integrated circuit of claim 1, wherein the first dielectric material of the first spacer and second spacers is etch selective with respect to the second dielectric material of the layer.

9. The integrated circuit of claim 1, wherein the first conductive structure is a contact to one of a source or a drain of a transistor, and the second conductive structure is a contact to the other of the source or a drain of the transistor.

10. The integrated circuit of claim 9, wherein the transistor is a bottom-gated transistor, such that source and drain contacts of the transistor is above the transistor, and a gate contact of the transistor is below the transistor.

11. The integrated circuit of claim 1, wherein one of the first or second conductive structures is coupled to an electrode of a capacitor, and the other of the first or second conductive structures is coupled to a bit line of a memory array.

12. The integrated circuit of claim 11, wherein the first and second conductive structures is coupled to a transistor, and wherein the transistor and the capacitor form a memory cell of the memory array.

13. An integrated circuit comprising:

a conductive structure;

a first layer comprising a first dielectric material, and a second layer comprising a second dielectric material that is compositionally different from the first dielectric material; and an interconnect feature comprising (i) a lower portion that is at least partially landed on the conductive structure, and (ii) an upper portion above the lower portion, wherein the lower portion is laterally between the first layer and the second layer, and wherein the upper portion extends above the first layer and at least partially lands on a top surface of the first layer.

14. The integrated circuit of claim 13, wherein the interconnect feature comprises a continuous and monolithic body of conductive material within the upper and lower portions.

15. The integrated circuit of claim 13, wherein:

the lower portion of the interconnect feature has (i) a first sidewall adjacent to the first layer, and (ii) a second sidewall adjacent to the second layer; and the first sidewall is at a first angle with a top surface of the conductive structure, the second sidewall is at a second angle with the top surface of the conductive structure, and the first angle is at least 3 degrees greater than the second angle.

16. The integrated circuit of claim 13, wherein the conductive structure is a first conductive structure, wherein the interconnect feature is a first interconnect feature, and wherein the integrated circuit further comprises:

a second conductive structure;

a third layer comprising the first dielectric material; and a second interconnect feature laterally between the first layer and the third layer.

17. The integrated circuit of claim 16, wherein the first interconnect feature has a more tapered shape than the second interconnect feature, such that:

a first width of the first interconnect feature at or near a top surface of the first interconnect feature is at least 5% greater than a second width of the first interconnect feature at or near a bottom surface of the first interconnect feature; and a first width of the second interconnect feature at or near a top surface of the second interconnect feature is within 5% of a second width of the second interconnect feature at or near a bottom surface of the second interconnect feature.

18. An integrated circuit comprising:

a transistor;

a capacitor above the transistor;

a first layer and a second layer each comprising a first dielectric material, and a third layer comprising a second dielectric material, each of the first, second, and third layers between the capacitor and the transistor;

a first interconnect feature coupled to a first terminal of the transistor, the first interconnect feature laterally between and adjacent to the first and second layers; and a second interconnect feature that conductively couples a second terminal of the transistor to an electrode of the capacitor, wherein a lower portion of the second interconnect feature is laterally between and adjacent to the second and third layers.

19. The integrated circuit of claim 18, wherein:

the second interconnect feature comprises (i) the lower portion that is laterally between and adjacent to the second and third layers, and (ii) an upper portion above the lower portion; and the upper portion partially lands on a top surface of the second layer.

20. The integrated circuit of claim 18, wherein the transistor and the capacitor are part of a memory cell.

* * * * *